US006828607B1

(12) United States Patent
Pelella et al.

(10) Patent No.: US 6,828,607 B1
(45) Date of Patent: Dec. 7, 2004

(54) DISCONTINUOUS NITRIDE STRUCTURE FOR NON-VOLATILE TRANSISTORS

(75) Inventors: Mario M. Pelella, Mountain View, CA (US); Amy C. Tu, San Jose, CA (US); Richard K. Klein, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 83 days.

(21) Appl. No.: 10/315,458

(22) Filed: Dec. 9, 2002

(51) Int. Cl.$^7$ ............................................. H01L 29/768
(52) U.S. Cl. ...................................... 257/250; 257/239
(58) Field of Search ................................. 257/250, 239, 257/314, 315, 316, 326, 321; 438/264, 588

(56) References Cited

U.S. PATENT DOCUMENTS 5,923,978 A * 7/1999 Hisamune ................... 438/264

* cited by examiner

Primary Examiner—David Nelms
Assistant Examiner—Thinh T Nguyen
(74) Attorney, Agent, or Firm—Winstead Sechrest & Minick P.C.

(57) ABSTRACT

A multiple independent bit Flash memory cell has a gate that includes a first oxide layer, a discontinuous nitride layer on the first oxide layer, a second oxide layer on the discontinuous nitride layer and the first oxide layer, and a polysilicon layer on the second oxide layer. The discontinuous nitride layer has regions residing at different portions of the layer. These portions are separated by the second oxide layer. Thus, with a smaller channel length, charge that otherwise would migrate from one region to the other and/or strongly influence its neighboring it is blocked/impeded by the second oxide layer. In this manner, the potential for charge sharing between the regions is reduced, and a higher density chip multiple independent bit Flash memory cells may be provided.

10 Claims, 10 Drawing Sheets

DISCONTINUOUS NITRIDE STRUCTURE FOR NON-VOLATILE TRANSISTORS

FIELD OF THE INVENTION

The present invention relates to multiple independent bit Flash memory devices, and more particularly with charge sharing in multiple independent bit Flash memory devices.

BACKGROUND OF THE INVENTION

FIG. 1 illustrates the architecture of a multiple independent bit Flash memory cell. This architecture, known as the MirrorBit™ Architecture developed by Advanced Micro Devices™, comprises a gate 102, a source region 104, a drain region 106, and a body region 108. The gate 102 comprises a first layer of oxide 116, a layer of nitride 114, a second layer of oxide 112, and a layer of polysilicon 110. This single cell 100 is capable of storing two independent bits, stored as charge at the regions 118 and 120 at either side of the interface between the first oxide layer 116 and the nitride layer 114. It uses a symmetric transistor with similar source 104 and drain 106.

However, to ensure reliability, the channel length, i.e., the length of the gate 102, need to be a certain minimum length. Otherwise, charge sharing between the regions 118 and 120 may occur, and the bits stored there may become lost. This problem hinders the ability to provide greater density in Flash memories comprising MirrorBit-like Flash cells.

Accordingly, there exists a need for a method and device for reducing the potential for charge sharing in multiple independent bit Flash memory cells. The present invention addresses such a need.

SUMMARY OF THE INVENTION

A multiple independent bit Flash memory cell has a gate that includes a first oxide layer, a discontinuous nitride layer on the first oxide layer, a second oxide layer on the discontinuous nitride layer and the first oxide layer, and a polysilicon layer on the second oxide layer. The discontinuous nitride layer has regions residing at different portions of the layer. These portions are separated by the second oxide layer. Thus, with a smaller channel length, charge that otherwise would migrate from one region to the other and/or strongly influence its neighboring bit is blocked/impeded by the second oxide layer. In this manner, the potential for charge sharing between the regions is reduced, and a higher density chip multiple independent bit Flash memory cells may be provided.

DETAILED DESCRIPTION

The present invention provides a method and device for reducing the potential for charge sharing in multiple independent bit Flash memory cells. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

To more particularly describe the features of the present invention, please refer to FIGS. 2 through 8C in conjunction with the discussion below.

Figure 1:
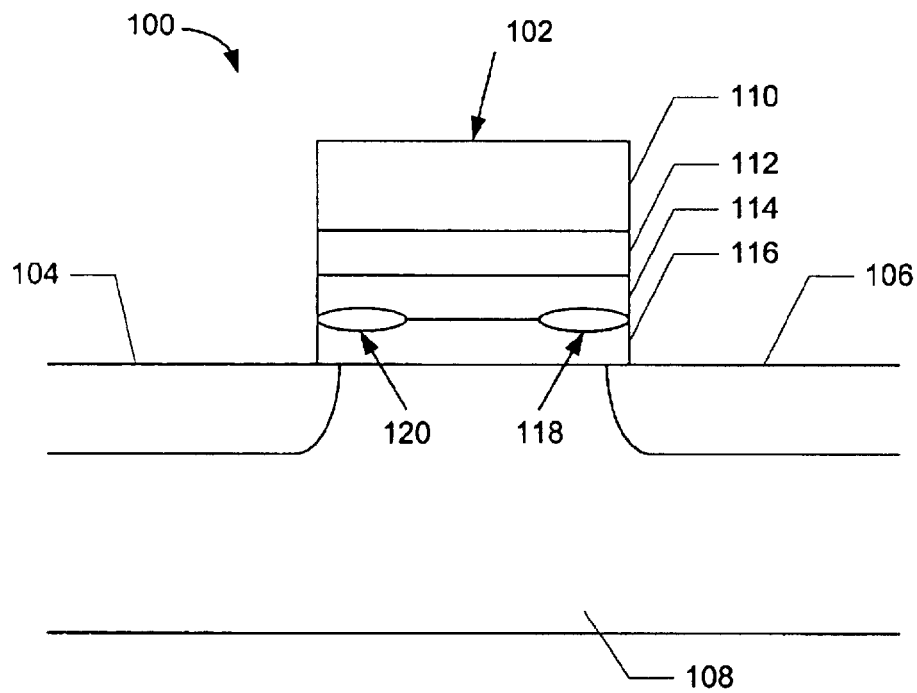
FIG. 1 illustrates the architecture of a multiple independent bit Flash memory cell.
Figure 2:
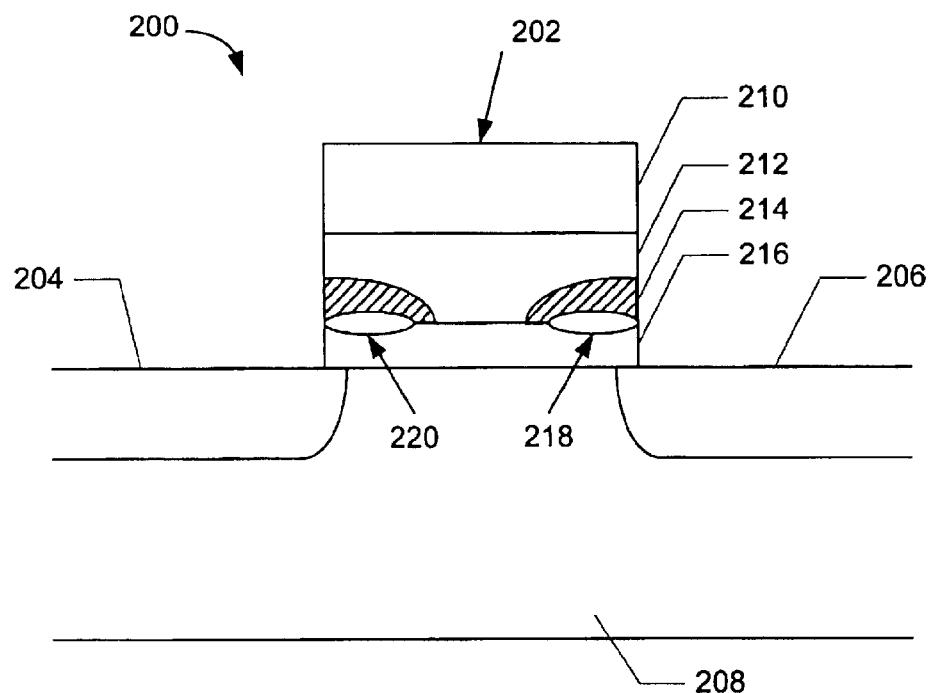
FIG. 2 illustrates an architecture for a preferred embodiment of a multiple independent bit Flash memory cell for reducing the potential for charge sharing in accordance with the present invention.

FIG. 2 illustrates an architecture for a preferred embodiment of a multiple independent bit Flash memory cell for reducing the potential for charge sharing in accordance with the present invention. The device 200 comprises a gate 202, a source region 204, a drain region 206, and a body region 208. The gate 202 comprises a first oxide layer 216, a discontinuous nitride layer 214, a second oxide layer 212, and polysilicon layer 210. The charges are stored at the regions 218 and 220 at either side of the interface between the first oxide layer 216 and the nitride layer 214.

In the cell 200 in accordance with the present invention, the gate 202 comprises a discontinuous nitride layer 214 with the regions 218 and 220 residing at different portions of the layer 214. The portions of the discontinuous nitride layer 214 are separated by the second oxide layer 212. Thus, with a smaller channel length, charge that otherwise would migrate from one region to the other and/or strongly influence its neighboring bit is blocked/impeded by the second oxide layer 212. In this manner, the potential for charge sharing between the regions 218 and 220 is reduced, and a higher density chip multiple independent bit Flash memory cells may be provided.

Figure 3:
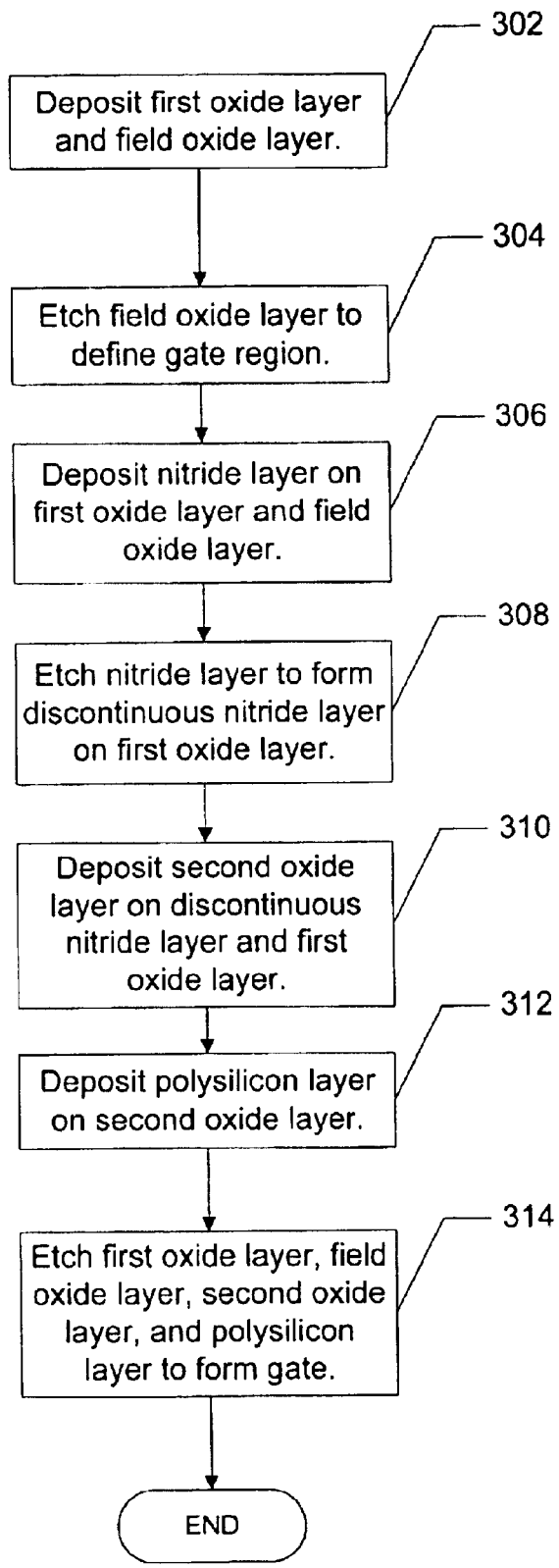
FIG. 3 is a flowchart illustrating a preferred embodiment of a method for manufacturing the multiple independent bit Flash memory cell in accordance with the present invention.
Figure 4A:
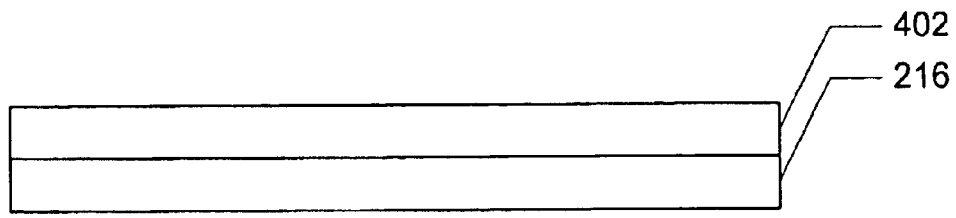
FIGS. 4A–4E illustrate the method steps set forth in FIG. 3.
Figure 4B:
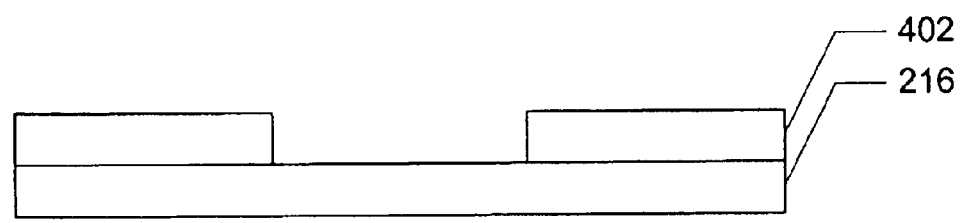
Figure 4C:
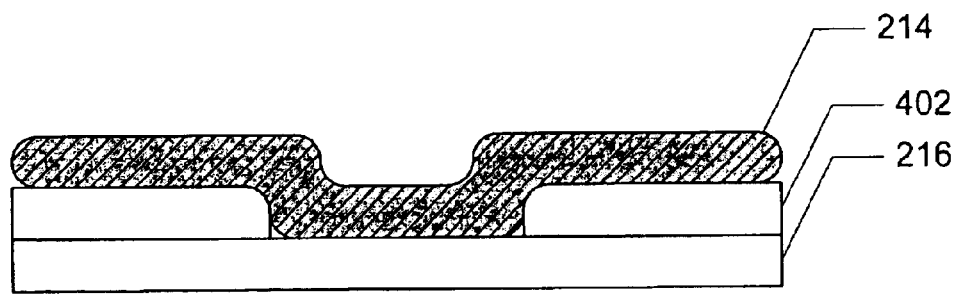
Figure 4D:
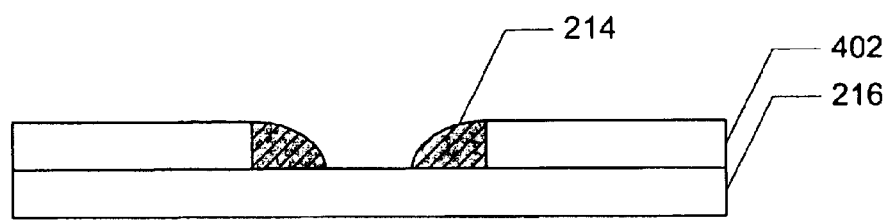
Figure 4E:
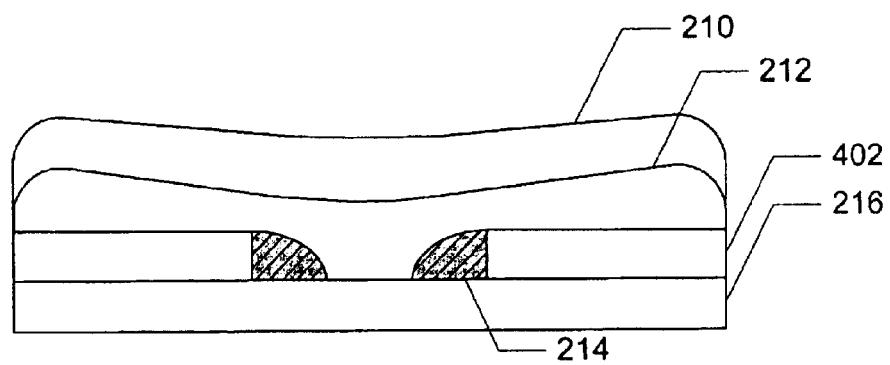

FIG. 3 is a flowchart illustrating a preferred embodiment of a method for manufacturing the multiple independent bit Flash memory cell in accordance with the present invention. FIGS. 4A–4E illustrate the method steps set forth in FIG. 3. As illustrated in FIG. 4A, first, the first oxide layer 216 and a field oxide layer 402 are deposited, via step 302. Next, as illustrated in FIG. 4B, the field oxide layer 402 is etched to define the gate region, via step 304. Next, as illustrated in FIG. 4C, the nitride layer 214 is deposited, via step 306, on the first oxide layer 216 and the field oxide layer 402. Then, as illustrated in FIG. 4D, the deposited nitride layer is etched to form the discontinuous nitride layer 214 on the first oxide layer 216, via step 308. Next, as illustrated in FIG. 4E, the second oxide layer 212 is deposited on the discontinuous nitride layer 214 and the first oxide layer 216, via step 310. The polysilicon layer is then deposited on the second oxide layer, via step 312. The first oxide layer 216, the field oxide layer 402, the second oxide layer 212, and the polysilicon layer 210 are etched, via step 314, to form the gate structure 202 illustrating in FIG. 2.

Although the present invention is described above in the context of the MirrorBit™ architecture, one of ordinary skill in the art will understand that the present invention may be applied to other architectures without departing from the spirit and scope of the present invention.

Figure 5:
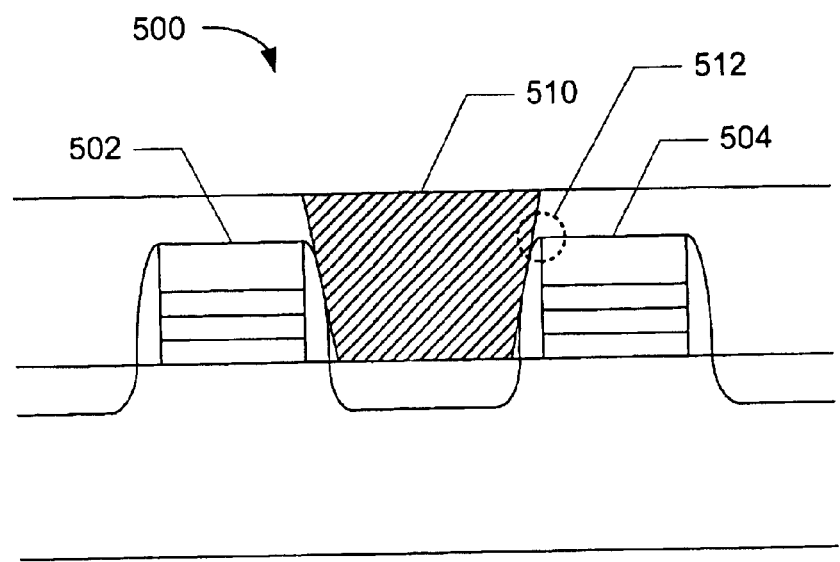
FIG. 5 illustrates another problem experienced by Flash memory cells.

FIG. 5 illustrates another problem experienced by Flash memory cells. To provide high density, the gates 502 and 504 of adjacent Flash memory cells are in close proximity. As such, these devices require a deep contact 510 between the two adjacent gates 502 and 504. This contact is small and has a high aspect ratio. Typically, Tungsten is used as the contact material. The process of creating a contact is known in the art and will not be further described here. To improve performance of the device, it is desirable to have the region of the contact 510 at the bottom to be as wide as possible. In addition, the contact hole widens due to the addition of a barrier metal layer and aggressive cleaning steps prior to the filling of the contact hole with Tungsten. With the widening of the contact hole, occasionally the contact 510 comes in very close proximity to the gate 504 in region 512 such that the gate 504 becomes shorted. This negatively impacts the device yield on a chip.

Figure 6:
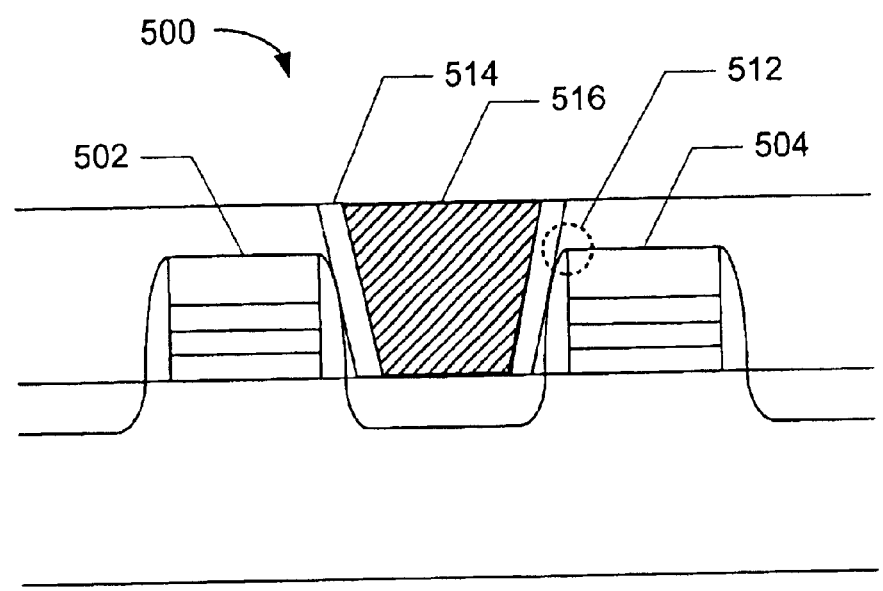
FIG. 6 illustrates a first preferred embodiment of a method and device for reducing the potential for contact to gate shorts in Flash memory cells in accordance with the present invention.

FIG. 6 illustrates a first preferred embodiment of a method and device for reducing the potential for contact to gate shorts in Flash memory cells in accordance with the present invention. In this first preferred embodiment, the contact hole is first lined with an insulating layer 514. Care is taken to avoid and remove residual insulating material from the bottom of the contact hole. Then, the contact hole is filled to form the contact 516. The insulating layer 514 provides a barrier between the contact 516 and an adjacent gate 504 in the vulnerable region 512, reducing the potential for a contact to gate short.

Figure 7A:
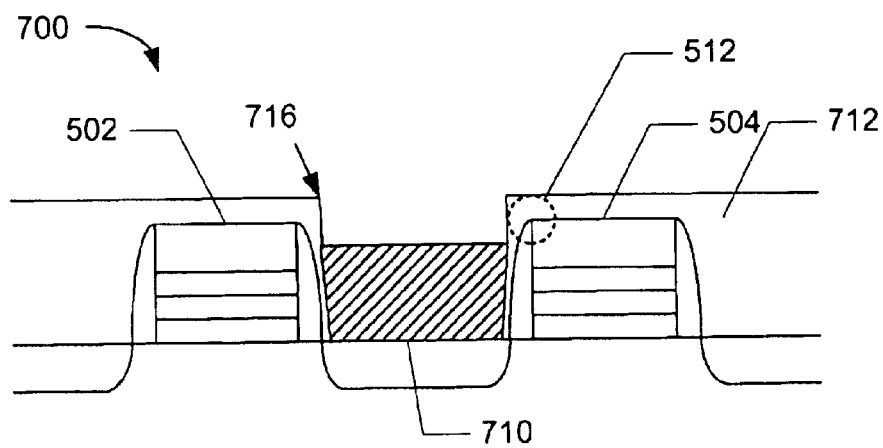
FIGS. 7A and 7B illustrate a second preferred embodiment of a method and device for reducing the potential for contact to gate shorts in Flash memory cells in accordance with the present invention.
Figure 7B:
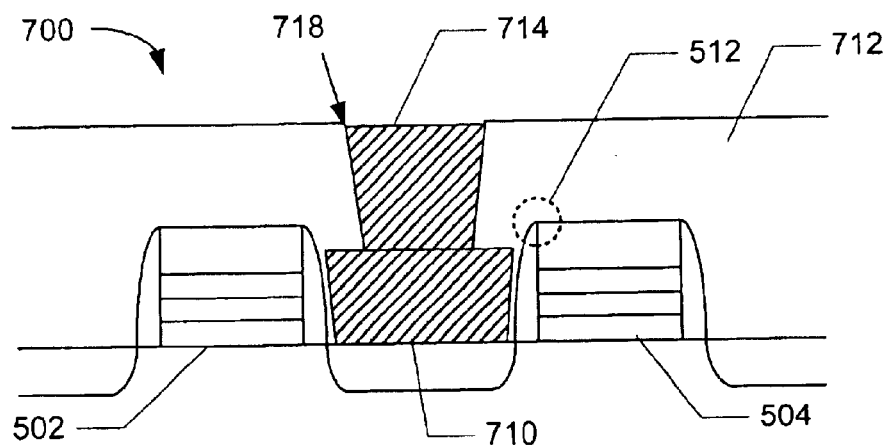

FIGS. 7A and 7B illustrate a second preferred embodiment of a method and device for reducing the potential for contact to gate shorts in Flash memory cells in accordance with the present invention. In this second preferred embodiment, the contact fill is performed in two stages. First, a first contact hole 716 is filled and etched back, forming the first portion 710 of the contact, as illustrated in FIG. 7A. Then, additional insulator 712 is deposited and a second contact hole 718 is etched. This second contact hole 718 is narrower than the first contact hole 716. The second contact hole 718 is then filled and etched back, forming the second portion 714 of the contact, as illustrated in FIG. 7B. In this manner, a contact is formed which is wider in the lower or first portion 710 and narrower in the upper or second portion 714. The advantage of a wide bottom contact is thus realized. At the same time, the narrower upper portion 714 reduces the potential for contact to gate short by having more distance between the contact and the gate 504 in the region 512.

Figure 8A:
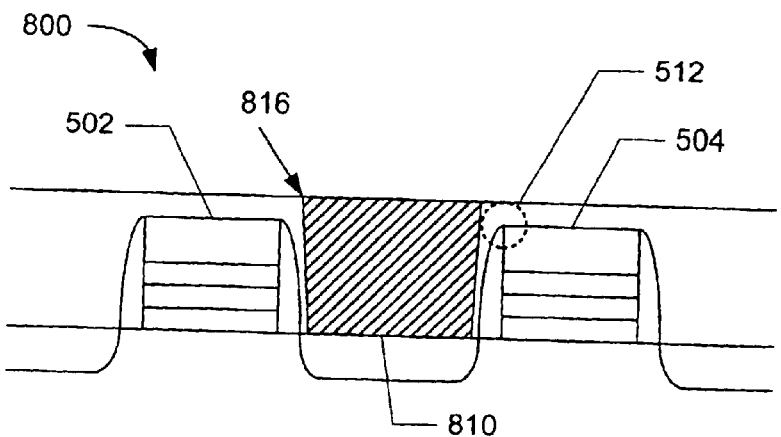
FIGS. 8A–8C illustrate a third preferred embodiment of a method and device for reducing the potential for contact to gate shorts in Flash memory cells in accordance with the present invention.
Figure 8B:
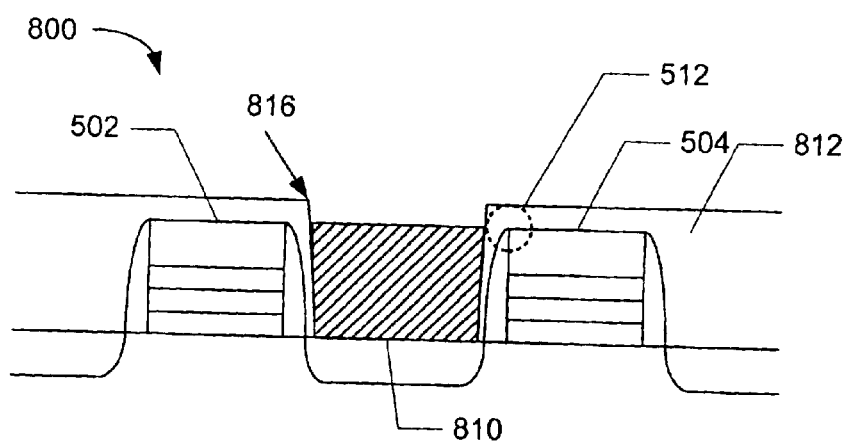
Figure 8C:
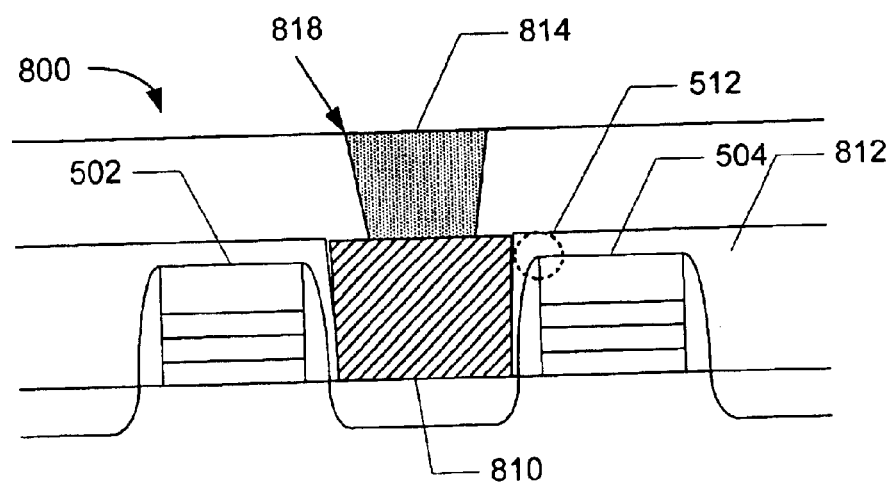

FIGS. 8A–8C illustrate a third preferred embodiment of a method and device for reducing the potential for contact to gate shorts in Flash memory cells in accordance with the present invention. In this third preferred embodiment, the first contact hole 816 is first filled with a pre-doped polysilicon 810, as illustrated in FIG. 8A. The polysilicon 810 is then etched back, as illustrated in FIG. 8B. Then, additional insulator 812 is deposited and a second contact hole 818 is etched, as illustrated in FIG. 8C. The second contact hole 818 is narrower than the first contact hole 816. A contact material, such as Tungsten, is then used to fill the second contact hole 818. Pre-doped polysilicon does not require a barrier metal layer or aggressive cleaning, and the etching back of the polysilicon is not as damaging as the etching back of Tungsten. Thus, the first contact hole 816 is not subjected to the same degree of widening as a process which uses Tungsten. The distance between the pre-doped polysilicon 810 and the gate 504 is greater than if Tungsten was used. In this manner, a wide bottom contact is realized while the potential for contact to gate short in the region 512 is reduced.

A method and device for reducing the potential for charge sharing in multiple independent bit Flash memory cells have been disclosed. In the cell in accordance with the present invention, the gate comprises a discontinuous nitride layer with regions residing at different portions of the layer. The portions of the discontinuous nitride layer are separated by the second oxide layer of the gate. Thus, with a smaller channel length, charge that otherwise would migrate from one region to the other and/or strongly influence its neighboring bit is blocked/impeded by the second oxide layer. In this manner, the potential for charge sharing between the regions is reduced, and a higher density chip multiple independent bit Flash memory cells may be provided.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A multiple independent bit Flash memory cell, comprising:
   a source;
   a drain; and
   a gate, comprising:
      a first oxide layer,
      a discontinuous nitride layer on the first oxide layer, wherein the discontinuous nitride layer comprises a first portion for storing a first charge and a second portion for storing a second charge,
      a second oxide layer on the discontinuous nitride layer and the first oxide layer, and
      a polysilicon layer on the second oxide layer.

2. The cell of claim 1, wherein the second oxide layer prevents charge sharing between the first and second portions of the discontinuous nitride layer.

3. The cell of claim 1, wherein the first charge and the second charge are stored independently of each other.

4. The cell of claim 1, wherein the cell is symmetric with similar source and drains.

5. A multiple independent bit Flash memory cell, comprising:
   a source;
   a drain; and
   a gate, comprising:
      a first oxide layer,
      a discontinuous nitride layer on the first oxide layer, wherein the discontinuous nitride layer comprises a first portion for storing a first charge and a second portion for storing a second charge, wherein the first charge and the second charge are stored independently of each other,
      a second oxide layer on the discontinuous nitride layer and the first oxide layer, wherein the second oxide layer prevents charge sharing between the first and second portions of the discontinuous nitride layer, and
      a polysilicon layer on the second oxide layer.

6. A method for providing a multiple independent bit Flash memory cell, comprising the steps of:
  (a) depositing a first oxide layer;
  (b) depositing a nitride layer on the first oxide layer;
  (c) etching the nitride layer to form a discontinuous nitride layer;
  (d) depositing a second oxide layer on the discontinuous nitride layer and the first oxide layer; and
  (e) etching the first oxide layer, the second oxide layer, and the polysilicon layer to form a gate.

7. The method of claim 6, wherein the depositing step (a) further comprises:
  (a1) depositing a field oxide layer on the first oxide layer; and
  (a2) etching the field oxide layer to define a gate region.

8. The method of claim 6, wherein the discontinuous nitride layer comprises a first portion for storing a first charge and a second portion for storing a second charge.

9. The method of claim 8, wherein the first charge and the second charge are stored independently of each other.

10. The method of claim 8, wherein the second oxide layer prevents charge sharing between the first portion and the second portion.

* * * * *